(12) United States Patent
Cheng

(10) Patent No.: US 12,095,002 B2
(45) Date of Patent: Sep. 17, 2024

(54) GROUP-III-NITRIDE STRUCTURES AND MANUFACTURING METHODS THEREOF

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 4 days.

(21) Appl. No.: 17/437,606

(22) PCT Filed: May 27, 2020

(86) PCT No.: PCT/CN2020/092690
§ 371 (c)(1),
(2) Date: Sep. 9, 2021

(87) PCT Pub. No.: WO2021/237528
PCT Pub. Date: Dec. 2, 2021

(65) Prior Publication Data
US 2023/0073455 A1 Mar. 9, 2023

(51) Int. Cl.
*H01L 33/12* (2010.01)
*C30B 25/04* (2006.01)
(Continued)

(52) U.S. Cl.
CPC .............. *H01L 33/12* (2013.01); *C30B 25/04* (2013.01); *C30B 25/20* (2013.01); *C30B 29/403* (2013.01);
(Continued)

(58) Field of Classification Search
CPC ....... C30B 25/04; C30B 29/403; C30B 25/20; H01L 21/02458; H01L 21/02502;
(Continued)

(56) References Cited

U.S. PATENT DOCUMENTS

| 6,051,849 A | 4/2000 | Davis et al. |
| 6,153,010 A | 11/2000 | Kiyoku et al. |

(Continued)

FOREIGN PATENT DOCUMENTS

| CN | 1292149 A | 4/2001 |
| CN | 1516238 A | 7/2004 |

(Continued)

OTHER PUBLICATIONS

ISA State Intellectual Property Office of the People's Republic of China, International Search Report Issued in Application No. PCT/CN2020/092690, Feb. 19, 2021, WIPO, 5 pages.

(Continued)

*Primary Examiner* — Jaehwan Oh
(74) *Attorney, Agent, or Firm* — Getech Law LLC; Jun Ye

(57) ABSTRACT

A group-III-nitride structure and a manufacturing method thereof are provided. In the manufacturing method, a first mask layer is first formed on a substrate; an uncoalesced second group-III-nitride epitaxial layer is formed by performing a first epitaxial growth with the first mask layer as a mask; and a second mask layer is formed at least on the second group-III-nitride epitaxial layer; a third group-III-nitride epitaxial layer is laterally grown and formed by performing a second epitaxial growth on the second group-III-nitride epitaxial layer with the second mask layer as a mask, where the second group-III-nitride epitaxial layer is coalesced by the third group-III-nitride epitaxial layer; a fourth group-III-nitride epitaxial layer is formed by performing a third epitaxial growth on the third group-III-nitride epitaxial layer.

20 Claims, 5 Drawing Sheets

(51) Int. Cl.
  *C30B 25/20* (2006.01)
  *C30B 29/40* (2006.01)
  *H01L 33/00* (2010.01)
  *H01L 33/16* (2010.01)
  *H01L 33/32* (2010.01)

(52) U.S. Cl.
  CPC ............ *H01L 33/007* (2013.01); *H01L 33/16* (2013.01); *H01L 33/32* (2013.01)

(58) Field of Classification Search
  CPC ........... H01L 21/0254; H01L 21/02639; H01L 21/02647; H01L 33/007
  See application file for complete search history.

(56) References Cited

U.S. PATENT DOCUMENTS

| | | | |
|---|---|---|---|
| 6,265,289 B1 * | 7/2001 | Zheleva | H01L 21/0254 257/190 |
| 6,570,192 B1 | 5/2003 | Davis et al. | |
| 6,602,763 B2 | 8/2003 | Davis et al. | |
| 6,608,327 B1 | 8/2003 | Davis et al. | |
| 6,756,611 B2 | 6/2004 | Kiyoku et al. | |
| 6,940,103 B2 | 9/2005 | Kiyoku et al. | |
| 7,083,679 B2 | 8/2006 | Kiyoku et al. | |
| 7,154,128 B2 | 12/2006 | Kiyoku et al. | |
| 7,198,971 B2 | 4/2007 | Shin | |
| 7,442,254 B2 | 10/2008 | Kiyoku et al. | |
| RE42,770 E | 10/2011 | Kiyoku et al. | |
| 2001/0007242 A1 | 7/2001 | Davis et al. | |
| 2001/0009167 A1 * | 7/2001 | Davis | H01L 21/02647 117/104 |
| 2002/0046693 A1 | 4/2002 | Kiyoku et al. | |
| 2002/0148534 A2 | 10/2002 | Davis et al. | |
| 2003/0037722 A1 * | 2/2003 | Kiyoku | C30B 25/02 257/E21.108 |
| 2004/0029365 A1 * | 2/2004 | Linthicum | C30B 25/02 257/E21.127 |
| 2004/0094773 A1 | 5/2004 | Kiyoku et al. | |
| 2005/0139857 A1 | 6/2005 | Shin | |
| 2005/0202682 A1 | 9/2005 | Kiyoku et al. | |
| 2007/0057276 A1 | 3/2007 | Kiyoku et al. | |
| 2013/0009182 A1 | 1/2013 | Jung et al. | |

FOREIGN PATENT DOCUMENTS

| | | |
|---|---|---|
| CN | 1638041 A | 7/2005 |
| JP | 2007053404 A | 3/2007 |

OTHER PUBLICATIONS

ISA State Intellectual Property Office of the People's Republic of China, Written Opinion of the International Searching Authority Issued in Application No. PCT/CN2020/092690, Feb. 19, 2021, WIPO, 6 pages. (Submitted with Partial/Machine translation).

* cited by examiner

GROUP-III-NITRIDE STRUCTURES AND MANUFACTURING METHODS THEREOF

CROSS-REFERENCE TO RELATED APPLICATION

This application is a US National Phase of a PCT Application No. PCT/CN2020/092690 filed on May 27, 2020, the contents of which are incorporated herein by reference in its entirety.

TECHNICAL FIELD

The present application relates to the field of semiconductor technologies, and in particular, to group-III-nitride structures and manufacturing methods thereof.

BACKGROUND

Group-III-nitride is a third-generation new semiconductor material subsequent to first and second-generation semiconductor materials such as Si, GaAs, etc. GaN, as a wide bandgap semiconductor material, has many advantages, such as high saturation drift speed, large breakdown voltage, excellent carrier transportation performance, capability of forming AlGaN, InGaN ternary alloy, AlInGaN quaternary alloy, etc., and a GaN-based PN junction can be easily manufactured. In view of this, in recent years, GaN-based materials and semiconductor devices have gained extensive and intensive studies, and growing GaN-based materials by Metal-organic Chemical Vapor Deposition (MOCVD) technology has evolved. In terms of research on semiconductor devices, research on photoelectronic devices such as GaN-based LEDs and GaN-based LDs and microelectronic devices such as GaN-based HEMTs have made significant achievements and rapid progress.

As the application of the GaN-based materials to power devices/display devices gradually deepens, requirement of terminal products on a dislocation density of the GaN-based materials is further increased, and the dislocation density of the GaN-based material epitaxially grown on the mainstream GaN-based epitaxial substrate aluminum trioxide ($Al_2O_3$) substrate using the mainstream MOCVD epitaxial equipment in the traditional mode is about 1-3E8/cm^3. In order to manufacture higher voltage resistant GaN-based power devices and longer band GaN-based LEDs, the dislocation density of the GaN-based materials should be further reduced.

In view of this, it is indeed necessary to provide a new group-III-nitride structure and a manufacturing method thereof, so as to satisfy the above requirements.

SUMMARY

An object of the present disclosure is to provide group-III-nitride structures and manufacturing methods thereof, which reduce the dislocation density of the group-III-nitride material and improve the performance of the group-III-nitride semiconductor devices.

In order to achieve the above object, a first aspect of the present disclosure provides a method for manufacturing a group-III-nitride structure, including:

forming a first mask layer on a substrate; growing and forming a second group-III-nitride epitaxial layer on the substrate and the first mask layer by performing a first epitaxial growth with the first mask layer as a mask, where the second group-III-nitride epitaxial layer on the first mask layer is not coalesced;

forming a second mask layer at least on the second group-III-nitride epitaxial layer; laterally growing and forming a third group-III-nitride epitaxial layer by performing a second epitaxial growth on the second group-III-nitride epitaxial layer with the second mask layer as a mask, where the third group-III-nitride epitaxial layer coalesces the second group-III-nitride epitaxial layer;

growing and forming a fourth group-III-nitride epitaxial layer on the third group-III-nitride epitaxial layer and the second mask layer by performing a third epitaxial growth on the third group-III-nitride epitaxial layer.

It should be noted that the lateral direction in the present disclosure refers to a direction vertical to a thickness direction of the second group-III-nitride epitaxial layer.

Optionally, the substrate has a first group-III-nitride epitaxial layer; the first mask layer is formed on the first group-III-nitride epitaxial layer, and the first epitaxial growth is an epitaxial growth performed on the first group-III-nitride epitaxial layer.

Optionally, the substrate is replaced with the first group-III-nitride epitaxial layer; the first mask layer is formed on the first group-III-nitride epitaxial layer, and the first epitaxial growth is an epitaxial growth performed on the first group-III-nitride epitaxial layer.

Optionally, the second mask layer is further grown and formed on the first mask layer, and the third group-III-nitride epitaxial layer is grown and formed on the second mask layer.

Optionally, a material of the first mask layer includes at least one of silicon dioxide or silicon nitride; and/or a material of the second mask layer comprises at least one of silicon dioxide or silicon nitride.

Optionally, a material of the second group-III-nitride epitaxial layer, a material of the third group-III-nitride epitaxial layer and a material of the fourth group-III-nitride epitaxial layer are the same, and include at least one of GaN, AlN, AlGaN, InGaN or AlInGaN.

Optionally, processes for the epitaxial growth of the second group-III-nitride epitaxial layer and/or the third group-III-nitride epitaxial layer and/or the fourth group-III-nitride epitaxial layer include at least one of an atomic layer deposition method, a chemical vapor deposition method, a molecular beam epitaxial growth method, a plasma enhanced chemical vapor deposition method, a low pressure chemical vapor deposition method, or a metal organic compound chemical vapor deposition method.

Optionally, the processes for the epitaxial growth of the second group-III-nitride epitaxial layer, the third group-III-nitride epitaxial layer and the fourth group-III-nitride epitaxial layer are the metal organic compound chemical vapor deposition method; growing the second group-III-nitride epitaxial layer, forming the second mask layer, growing the third group-III-nitride epitaxial layer and the fourth group-III-nitride epitaxial layer are performed in a same metal organic compound chemical vapor deposition device.

Optionally, when the fourth group-III-nitride epitaxial layer located on the second mask layer is not coalesced, a fifth group-III-nitride epitaxial layer is further grown and formed on the second mask layer and the fourth group-III-nitride epitaxial layer.

Optionally, the method further includes: growing and forming an LED structure on the fifth group-III-nitride epitaxial layer.

Optionally, the method further includes: growing and forming an LED structure on the fourth group-III-nitride epitaxial layer.

Optionally, the method further includes: growing and forming an LED structure on the fourth group-III-nitride epitaxial layer.

Optionally, a method for forming the first group-III-nitride epitaxial layer includes: epitaxially growing the first group-III-nitride epitaxial layer on the substrate.

Optionally, the substrate includes at least one of sapphire, silicon carbide or silicon.

A second aspect of the present disclosure provides a group-III-nitride structure, including:

a substrate having a first mask layer located thereon;

a second group-III-nitride epitaxial layer, located on the first mask layer and the substrate, where the second group-III-nitride epitaxial layer is not coalesced, and has a second mask layer located thereon;

a third group-III-nitride epitaxial layer, located on the first mask layer and configured to coalesce the second group-III-nitride epitaxial layer;

a fourth group-III-nitride epitaxial layer, located on the third group-III-nitride epitaxial layer and the second mask layer, where [0001] crystal orientations of the second group-III-nitride epitaxial layer, the third group-III-nitride epitaxial layer and the fourth group-III-nitride epitaxial layer are parallel to a thickness direction of the substrate.

Optionally, the structure further includes: a first group-III-nitride epitaxial layer located on the substrate; where the first mask layer is located on the first group-III-nitride epitaxial layer, and the second group-III-nitride epitaxial layer is connected with the first group-III-nitride epitaxial layer.

Optionally, the structure further includes a first group-III-nitride epitaxial layer, and the substrate is replaced with the first group-III-nitride epitaxial layer; where the first mask layer is located on the first group-III-nitride epitaxial layer, and the second group-III-nitride epitaxial layer is connected with the first group-III-nitride epitaxial layer.

Optionally, a material of the second group-III-nitride epitaxial layer, a material of the third group-III-nitride epitaxial layer and a material of the fourth group-III-nitride epitaxial layer are the same, and include at least one of GaN, AlN, AlGaN, InGaN or AlInGaN.

Optionally, the first mask layer further includes the second mask layer, and the third group-III-nitride epitaxial layer is located on the second mask layer.

Optionally, a material of the first mask layer includes at least one of silicon dioxide or silicon nitride; and/or a material of the second mask layer includes at least one of silicon dioxide or silicon nitride.

Optionally, the second group-III-nitride epitaxial layer is an in-situ second group-III-nitride epitaxial layer; and/or the second mask layer is an in-situ second mask layer; and/or the third group-III-nitride epitaxial layer is an in-situ third group-III-nitride epitaxial layer; and/or the fourth group-III-nitride epitaxial layer is an in-situ fourth group-III-nitride epitaxial layer.

Optionally, the fourth group-III-nitride epitaxial layer on the second mask layer is not coalesced, and the second mask layer and the fourth group-III-nitride epitaxial layer have a fifth group-III-nitride epitaxial layer located thereon.

Optionally, the structure further includes: an LED structure located on the fifth group-III-nitride epitaxial layer.

Optionally, the structure further includes: an LED structure located on the fourth group-III-nitride epitaxial layer.

Optionally, the structure further includes: a substrate on which the first group-III-nitride epitaxial layer is located.

Optionally, the substrate includes at least one of sapphire, silicon carbide or silicon.

Compared with the prior art, the present disclosure has the following beneficial effects.

1) In the method of manufacturing a group-III-nitride structure of the present disclosure, a first mask layer is formed on a substrate; a second group-III-nitride epitaxial layer is grown and formed on the substrate and the first mask layer by performing a first epitaxial growth with the first mask layer as a mask, the second group-III-nitride epitaxial layer on the first mask layer is not coalesced; then, a second mask layer is formed at least on the second group-III-nitride epitaxial layer; a third group-III-nitride epitaxial layer is laterally grown and formed by performing a second epitaxial growth on the second group-III-nitride epitaxial layer with the second mask layer as a mask, the third group-III-nitride epitaxial layer coalesces the second group-III-nitride epitaxial layer; then, a fourth group-III-nitride epitaxial layer is grown and formed on the third group-III-nitride epitaxial layer and the second mask layer by performing a third epitaxial growth on the third group-III-nitride epitaxial layer. Since a dislocation of the second group-III-nitride epitaxial layer is mainly a linear dislocation in the [0001] crystal origination, that is, a dislocation extending in a thickness direction of the second group-III-nitride epitaxial layer, the second epitaxial growth with the growth direction being lateral growth direction can block the dislocation from continuing to extend upward, thereby significantly reducing the dislocation density of the third group-III-nitride epitaxial layer and the fourth group-III-nitride epitaxial layer.

2) In an optional solution, a) the substrate has a first group-III-nitride epitaxial layer; or b) the substrate is replaced with the first group-III-nitride epitaxial layer. In the present solution, the first mask layer is formed on the first group-III-nitride epitaxial layer, and the first epitaxial growth is an epitaxial growth performed on the first group-III-nitride epitaxial layer. Compared with selectively growing the second group-III-nitride epitaxial layer directly on the substrate, the second group-III-nitride epitaxial layer of the present solution is formed by epitaxially growing the first group-III-nitride epitaxial layer, which can reduce defects of the second group-III-nitride epitaxial layer.

3) In an optional solution, the second mask layer is further formed on the first mask layer, and the third group-III-nitride epitaxial layer is grown and formed on the second mask layer. In the present solution, for the second mask layer deposited on a whole surface, only the second mask layer on one or more sidewalls of the second group-III-nitride epitaxial layer need to be removed.

4) In an optional solution, a) a material of the second group-III-nitride epitaxial layer, a material of the third group-III-nitride epitaxial layer and a material of the fourth group-III-nitride epitaxial layer are the same, or b) at least two of the material of the second group-III-nitride epitaxial layer, the material of the third group-III-nitride epitaxial layer and the material of the fourth group-III-nitride epitaxial layer are different. The materials of the second group-III-nitride epitaxial layer, and/or the third group-III-nitride epitaxial layer, and/or the fourth group-III-nitride epitaxial layer can include at least one of GaN, AlN, AlGaN, InGaN, or AlInGaN. The specific materials of the second group-III-nitride epitaxial layer, the third group-III-nitride epitaxial layer and the fourth group-III-nitride epitaxial layer can be determined according to functions, and the specific functions can include: a substrate, a buffer layer, a barrier layer or a channel layer in a device.

5) In an optional solution, processes for the epitaxial growth of the second group-III-nitride epitaxial layer, the third group-III-nitride epitaxial layer and the fourth group-III-nitride epitaxial layer are the metal organic compound chemical vapor deposition method; growing the second group-III-nitride epitaxial layer, forming the second mask layer, growing the third group-III-nitride epitaxial layer, and the fourth group-III-nitride epitaxial layer are performed in a same metal organic compound chemical vapor deposition device (MOCVD device). In other words, the second group-III-nitride epitaxial layer is an in-situ second group-III-nitride epitaxial layer, the second mask layer is an in-situ second mask layer, the third group-III-nitride epitaxial layer is an in-situ third group-III-nitride epitaxial layer, and the fourth group-III-nitride epitaxial layer is an in-situ fourth group-III-nitride epitaxial layer. The advantages of in-situ proceeding are that the process complexity can be reduced, and the transfer processes between different devices in a plurality of processes are reduced, and the contamination source is avoided to participate in the processes interfering with the quality of the second group-III-nitride epitaxial layer and the third group-III-nitride epitaxial layer and the fourth group-III-nitride epitaxial layer.

6) In an optional solution, when the fourth group-III-nitride epitaxial layer on the second mask layer is not coalesced, a fifth group-III-nitride epitaxial layer is further grown and formed on the second mask layer and the fourth group-III-nitride epitaxial layer. When a material of the fifth group-III-nitride epitaxial layer is different from the material of the fourth group-III-nitride epitaxial layer, with the present solution, stresses in the fifth group-III-nitride epitaxial layer can be effectively released, and dislocations and V-type pits in the fifth group-III-nitride epitaxial layer can be reduced.

7) In an optional solution, an LED structure is further grown and formed on the fourth group-III-nitride epitaxial layer or the fifth group-III-nitride epitaxial layer. The LED structure can include an N-type semiconductor layer, a P-type semiconductor layer, and a quantum well layer between the N-type semiconductor layer and the P-type semiconductor layer. In other words, the second group-III-nitride epitaxial layer, the third group-III-nitride epitaxial layer and the fourth group-III-nitride epitaxial layer serve as substrates of the LED structure, or the second group-III-nitride epitaxial layer, the third group-III-nitride epitaxial layer, the fourth group-III-nitride epitaxial layer and the fifth group-III-nitride epitaxial layer serve as the substrates of the LED structure, and a green LED, a yellow LED, a red LED, or even an infrared LED can be manufactured.

Figure 1:
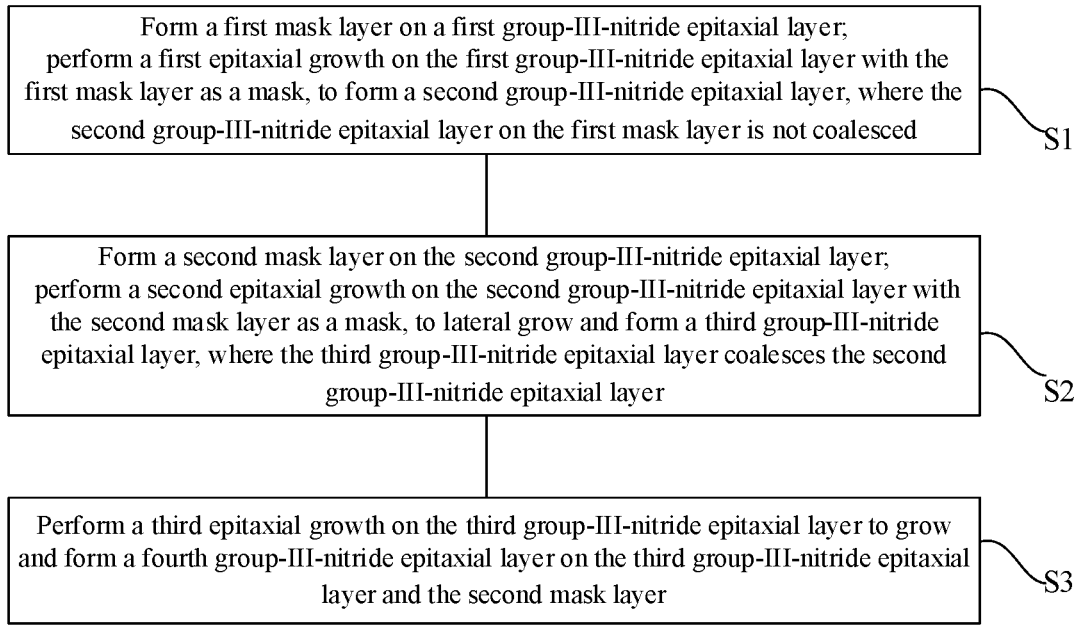
FIG. 1 is a flowchart of a method of manufacturing a group-III-nitride structure according to a first embodiment of the present disclosure.

To facilitate the understanding of the present disclosure, all reference signs present in the present disclosure are listed below:

| | |
|---|---|
| Group-III-nitride structures 1, 2, 3, 4, 5, 6, 7 | Substrate 10 |
| First group-III-nitride epitaxial layer 11 | First mask layer 12 |
| Second group-III-nitride epitaxial layer 13 | In-situ second group-III-nitride epitaxial layer 13' |
| Second mask layer 14 | In-situ second mask layer 14' |
| Third group-III-nitride epitaxial layer 15 | In-situ third group-III-nitride epitaxial layer 15' |
| Fourth group-III-nitride epitaxial layer 16 | In-situ fourth group-III-nitride epitaxial layer 16' |
| Fifth group-III-nitride epitaxial layer 17 | LED structure 18 |

DETAILED DESCRIPTION OF THE EMBODIMENTS

In order to make the above objects, features and advantages of the present disclosure more apparent, specific embodiments of the present disclosure will be described in detail below with reference to the accompanying drawings.

FIG. 1 is a flowchart of a method of manufacturing a group-III-nitride structure according to a first embodiment of the present disclosure. FIGS. 2 to 5 are schematic views illustrating intermediate structures corresponding to the flow in FIG. 1. FIG. 6 is a schematic cross-sectional view illustrating a group-III-nitride structure according to a first embodiment of the present disclosure.

Figure 2:
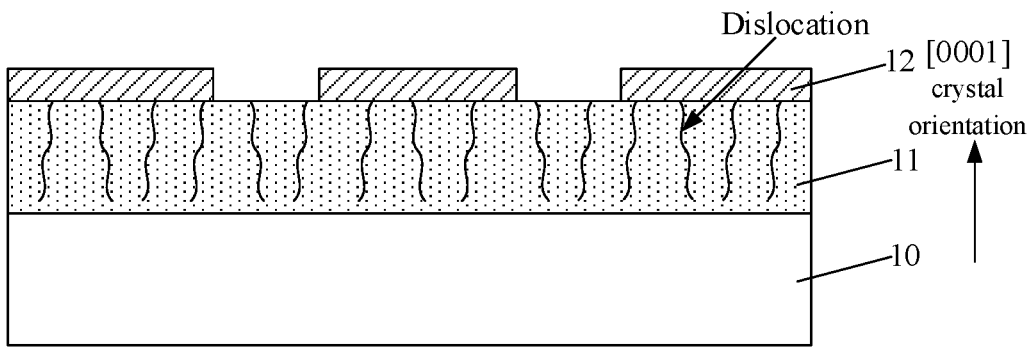
FIGS. 2 to 5 are schematic views illustrating intermediate structures corresponding to the flow in FIG. 1.
Figure 3:
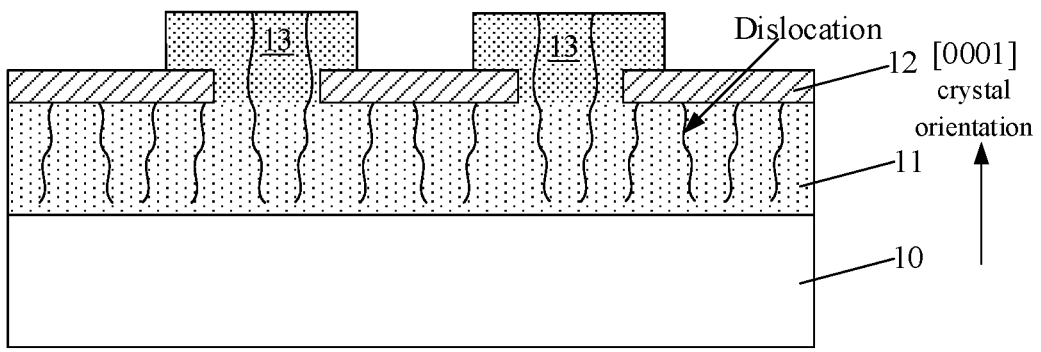

First, referring to step S1 in FIG. 1 and FIG. 2, a first mask layer 12 is formed on a first group-III-nitride epitaxial layer 11; referring to FIG. 3, a first epitaxial growth is performed on the first group-III-nitride epitaxial layer 11 with the first mask layer 12 as a mask, to form a second group-III-nitride epitaxial layer 13, where the second group-III-nitride epitaxial layer 13 on the first mask layer 12 is not coalesced.

Referring to FIG. 2, in the present embodiment, the first group-III-nitride epitaxial layer 11 can be formed on a substrate 10. The substrate 10 can be at least one of sapphire, silicon carbide, or silicon, which is not limited in this embodiment.

A group-III-nitride material of the first group-III-nitride epitaxial layer 11 can be AlN, or at least one of GaN, AlGaN, InGaN, or AlInGaN, which is not limited in this embodiment. The AlN can be used as a nucleation layer. The first group-III-nitride epitaxial layer 11 has a dislocation, and the dislocation is mainly a linear dislocation in the [0001] crystal orientation, that is, the dislocation extends in a thickness direction of the first group-III-nitride epitaxial layer 11.

At step S1, the first group-III-nitride epitaxial layer 11 formed on the substrate 10 can be of an existing structure, or step S1 can include: epitaxially growing the first group-III-nitride epitaxial layer 11 on the substrate 10.

The formation process of the first group-III-nitride epitaxial layer 11 can include: an atomic layer deposition method (ALD), or a chemical vapor deposition method (CVD), or a molecular beam epitaxy method (MBE), or a plasma enhanced chemical vapor deposition method (PECVD), or a low pressure chemical vapor deposition method (LPCVD), or a metal organic compound chemical vapor deposition method, or a combination thereof.

In some embodiments, the first group-III-nitride epitaxial layer 11 after peeling off the substrate 10 can be the first group-III-nitride epitaxial layer 11 in step S1.

A material of the first mask layer 12 can include at least one of silicon dioxide and silicon nitride.

A material of the second group-III-nitride epitaxial layer 13 can be the same as or different from a material of the first group-III-nitride epitaxial layer 11. The material of the second group-III-nitride epitaxial layer 13 can be at least one of GaN, AlN, AlGaN, InGaN, and AlInGaN, which is not limited in this embodiment.

The formation process of the second group-III-nitride epitaxial layer 13 can refer to the formation process of the first group-III-nitride epitaxial layer 11. The first epitaxial growth includes growth in lateral and thickness directions.

Figure 4:
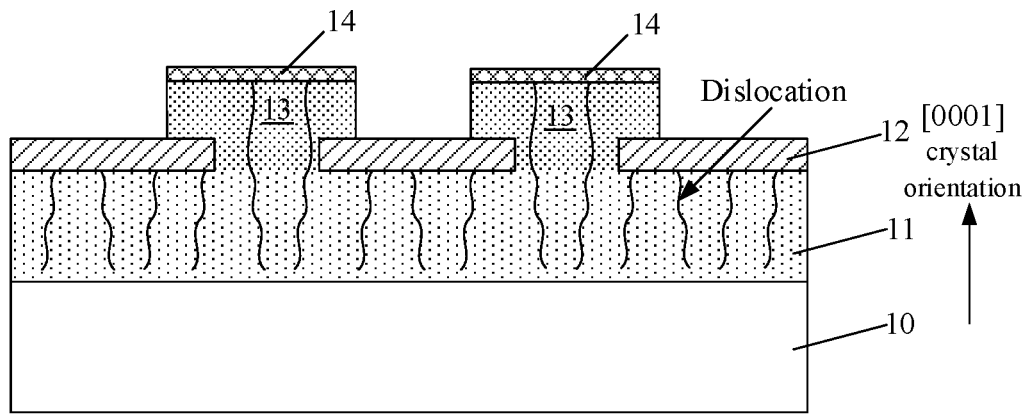
Figure 5:
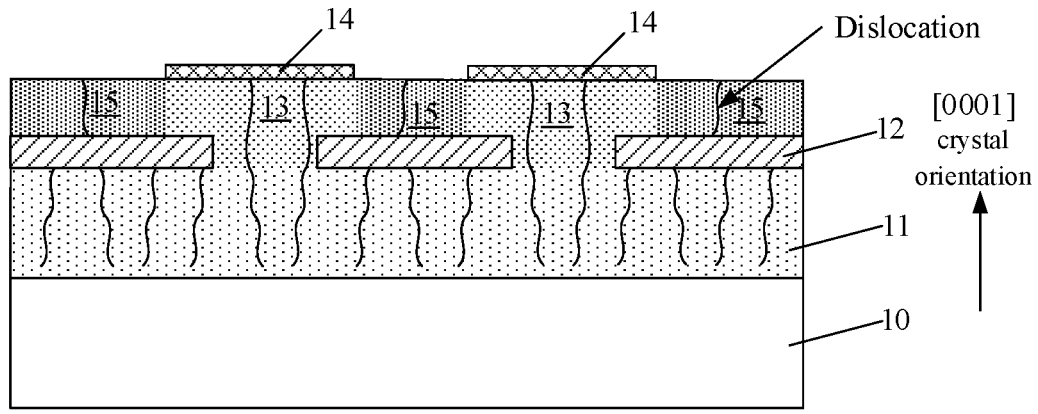
Figure 6:
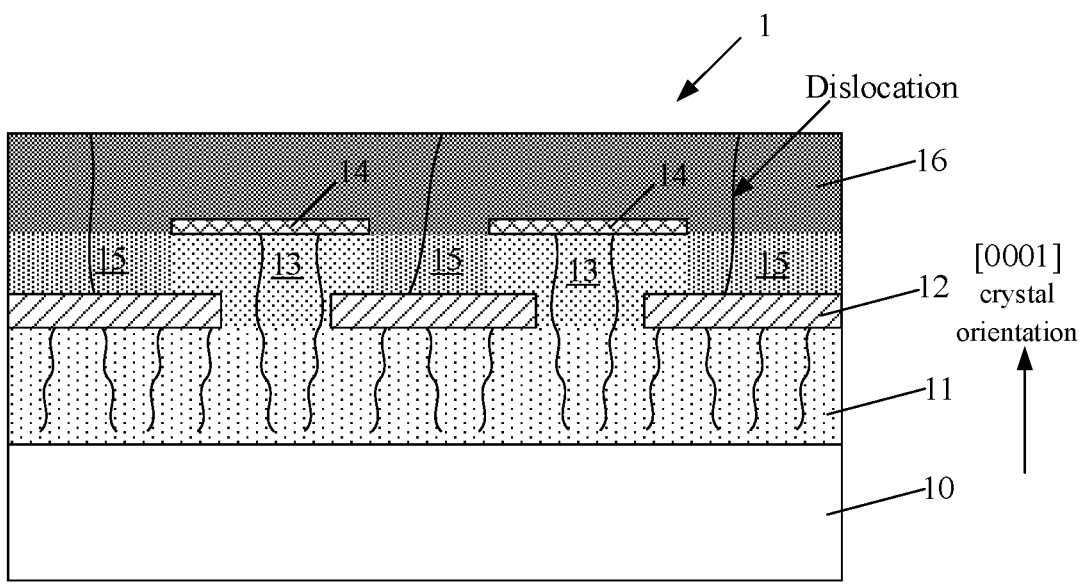
FIG. 6 is a schematic cross-sectional view illustrating a group-III-nitride structure according to a first embodiment of the present disclosure.

Next, referring to step S2 in FIG. 1 and FIG. 4, a second mask layer 14 is formed on the second group-III-nitride epitaxial layer 13; referring to FIG. 5, a second epitaxial growth is performed on the second group-III-nitride epitaxial layer 13 with the second mask layer 14 as a mask, to lateral grow and form a third group-III-nitride epitaxial layer 15, where the third group-III-nitride epitaxial layer 15 coalesces the second group-III-nitride epitaxial layer 13.

A material of the second mask layer 14 can include at least one of silicon dioxide and silicon nitride, and the forming method can include a physical vapor deposition method or a chemical vapor deposition method.

Referring to FIG. 4, in this embodiment, only the second mask layer 14 on the second group-III-nitride epitaxial layer 13 is retained. The second mask layer 14 on the first mask layer 12 and on one or more sidewalls of the second group-III-nitride epitaxial layer 13 can be removed by dry etching. For example, a photoresist is arranged on a whole surface, and a patterned photoresist after exposure and development is only located on the second mask layer 14.

Referring to FIG. 5, because the second mask layer 14 blocks the second group-III-nitride epitaxial layer 13, the second epitaxial growth performed on the second group-III-nitride epitaxial layer 13 cannot be realized in a thickness direction and can only be realized in a lateral direction. The dislocation of the second group-III-nitride epitaxial layer 13 is mainly a dislocation extending in the thickness direction, and thus lateral growth can block the dislocation in the thickness direction from continuing to extend upward, thereby significantly reducing a dislocation density of the third group-III-nitride epitaxial layer 15.

A material of the third group-III-nitride epitaxial layer 15 can be the same as or different from the material of the second group-III-nitride epitaxial layer 13. The material of the third group-III-nitride epitaxial layer 15 can be at least one of GaN, AlN, AlGaN, InGaN, or AlInGaN, which is not limited in this embodiment.

The formation process of the third group-III-nitride epitaxial layer 15 can refer to the formation process of the first group-III-nitride epitaxial layer 11.

Subsequently, referring to step S3 in FIG. 1 and FIG. 6, a third epitaxial growth is performed on the third group-III-nitride epitaxial layer 15 to grow and form a fourth group-III-nitride epitaxial layer 16 on the third group-III-nitride epitaxial layer 15 and the second mask layer 14.

The third epitaxial growth includes a growth in the lateral and thickness directions.

A material of the fourth group-III-nitride epitaxial layer 16 can be the same as or different from the material of the third group-III-nitride epitaxial layer 15. The material of the fourth group-III-nitride epitaxial layer 16 can be at least one of GaN, AlGaN, InGaN, or AlInGaN, which is not limited in this embodiment.

A function of the fourth group-III-nitride epitaxial layer 16, a function of the third group-III-nitride epitaxial layer 15, a function of the second group-III-nitride epitaxial layer 13, and a function of the first group-III-nitride epitaxial layer 11 can be the same or different. For example, the first group-III-nitride epitaxial layer 11 can be a substrate in a device, and the second group-III-nitride epitaxial layer 13 and the third group-III-nitride epitaxial layer 15 can be a nucleation layer in the device, and the fourth group-III-nitride epitaxial layer 16 can be a buffer layer, a barrier layer or a channel layer in the device. The buffer layer can reduce a threaded dislocation (TD) density in an upper semiconductor layer and a TD bending due to lateral growth mechanism. For another example, the first group-III-nitride epitaxial layer 11, the second group-III-nitride epitaxial layer 13 and the third group-III-nitride epitaxial layer 16 can be a nucleation layer in the device, and the fourth group-III-nitride epitaxial layer 16 can be a buffer layer, a barrier layer or a channel layer in the device; or the first group-III-nitride epitaxial layer 11 can be a substrate in the device, and the second group-III-nitride epitaxial layer 13 and the third group-III-nitride epitaxial layer 15 can be a nucleation layer and a buffer layer in the device, and the fourth group-III-nitride epitaxial layer 16 can be a barrier layer or a channel layer in the device.

FIG. 6 is a schematic cross-sectional view illustrating a group-III-nitride structure according to a first embodiment of the present disclosure.

As shown in FIG. 6, the group-III-nitride structure 1 of the present embodiment includes:

a first group-III-nitride epitaxial layer 11, and a first mask layer 12 located on the first group-III-nitride epitaxial layer 11;

a second group-III-nitride epitaxial layer 13 located on the first mask layer 12 and the first group-III-nitride epitaxial layer 11, where the second group-III-nitride epitaxial layer 13 is not coalesced, and a second mask layer 14 is provided on the second group-III-nitride epitaxial layer 13;

a third group-III-nitride epitaxial layer 15, located on the first mask layer 12 and configured to coalesce the second group-III-nitride epitaxial layer 13;

a fourth group-III-nitride epitaxial layer 16 located on the third group-III-nitride epitaxial layer 15 and the second mask layer 14, and [0001] crystal orientations of the first group-III-nitride epitaxial layer 11, the second group-III-nitride epitaxial layer 13, the third group-III-nitride epitaxial layer 15 and the fourth group-III-nitride epitaxial layer 16 are parallel to the thickness direction.

It can be seen that, since the second mask layer 14 blocks the second group-III-nitride epitaxial layer 13, the epitaxial growth performed on the second group-III-nitride epitaxial layer 13 cannot be realized in the thickness direction and can only be realized in the lateral direction. Since dislocations of the first group-III-nitride epitaxial layer 11 and the second group-III-nitride epitaxial layer 13 are mainly dislocations extending in the thickness direction, lateral growth can block the dislocations in the thickness direction from extending upward, thereby significantly reducing a dislocation density of the third group-III-nitride epitaxial layer 15 and a dislocation density of the fourth group-III-nitride epitaxial layer 16.

The materials of the first group-III-nitride epitaxial layer 11, the second group-III-nitride epitaxial layer 13, the third group-III-nitride epitaxial layer 15 and the fourth group-III-nitride epitaxial layer 16 can be the same or different. The material of the first group-III-nitride epitaxial layer 11, and/or the second group-III-nitride epitaxial layer 13, and/or the third group-III-nitride epitaxial layer 15, and/or the fourth group-III-nitride epitaxial layer 16 can be at least one of GaN, AlN, AlGaN, InGaN, or AlInGaN, which is not limited in this embodiment.

The function of the first group-III-nitride epitaxial layer 11, and/or the second group-III-nitride epitaxial layer 13, and/or the third group-III-nitride epitaxial layer 15, and/or the fourth group-III-nitride epitaxial layer 16 can be the same or different. The first group-III-nitride epitaxial layer 11, and/or the second group-III-nitride epitaxial layer 13, and/or the third group-III-nitride epitaxial layer 15, and/or the fourth group-III-nitride epitaxial layer 16 can be a substrate, a buffer layer, a barrier layer, or a channel layer in a device, etc.

The material of the second mask layer 14 can be a material inhibiting the growth of the second group-III-nitride epitaxial layer 13, for example, can include at least one of silicon dioxide or silicon nitride. The material of the first mask layer 12 can be selected from a material on which the second group-III-nitride epitaxial layer 13 can be attached, for example, can include at least one of silicon dioxide or silicon nitride.

In addition, referring to FIG. 6, in the present embodiment, the first group-III-nitride epitaxial layer 11 can be located on the substrate 10. The substrate 10 can be at least one of sapphire, silicon carbide, or silicon, which is not limited in this embodiment.

In some embodiments, the first group-III-nitride epitaxial layer 11 can be the first group-III-nitride epitaxial layer 11 with the substrate 10 peeled off.

Figure 7:
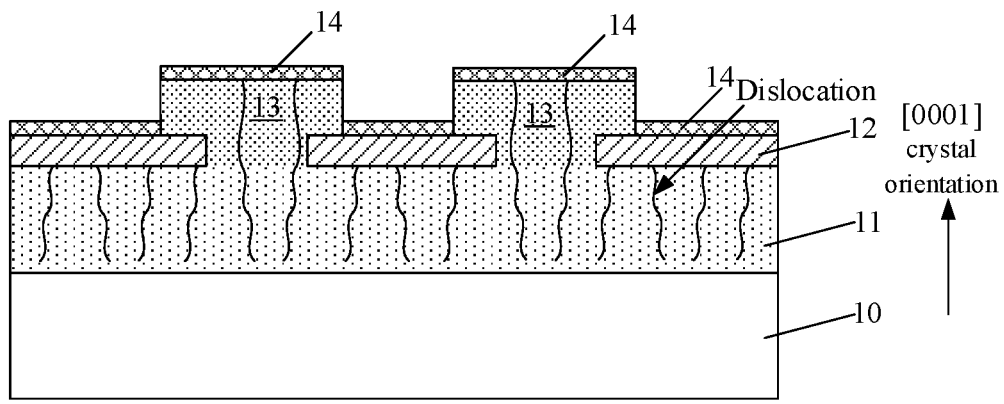
FIG. 7 is a schematic view illustrating an intermediate structure corresponding to a method of manufacturing a group-III-nitride structure according to a second embodiment of the present disclosure.
Figure 8:
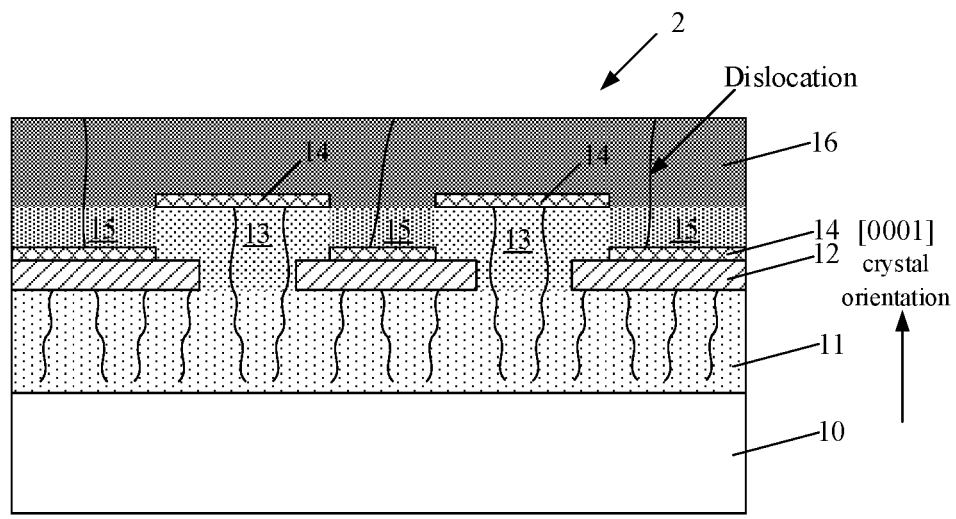
FIG. 8 is a schematic cross-sectional view illustrating a group-III-nitride structure according to a second embodiment of the present disclosure.

FIG. 7 is a schematic view illustrating an intermediate structure corresponding to a method of manufacturing a group-III-nitride structure according to a second embodiment of the present disclosure. FIG. 8 is a schematic cross-sectional view illustrating a group-III-nitride structure according to a second embodiment of the present disclosure. Referring to FIGS. 7 and 8, the group-III-nitride structure 2 and the manufacturing method thereof in the present embodiment are substantially the same as the group-III-nitride structure 1 and the manufacturing method thereof in the embodiments of FIGS. 1 to 6, and the difference merely lies in that, in step S2, the second mask layer 14 is further formed on the first mask layer 12, and the third group-III-nitride epitaxial layer 15 is grown and formed on the second mask layer 14.

In the present embodiment, in step S2, only the second mask layer 14 on the one or more sidewalls of the second group-III-nitride epitaxial layer 13 needs to be removed.

Figure 9:
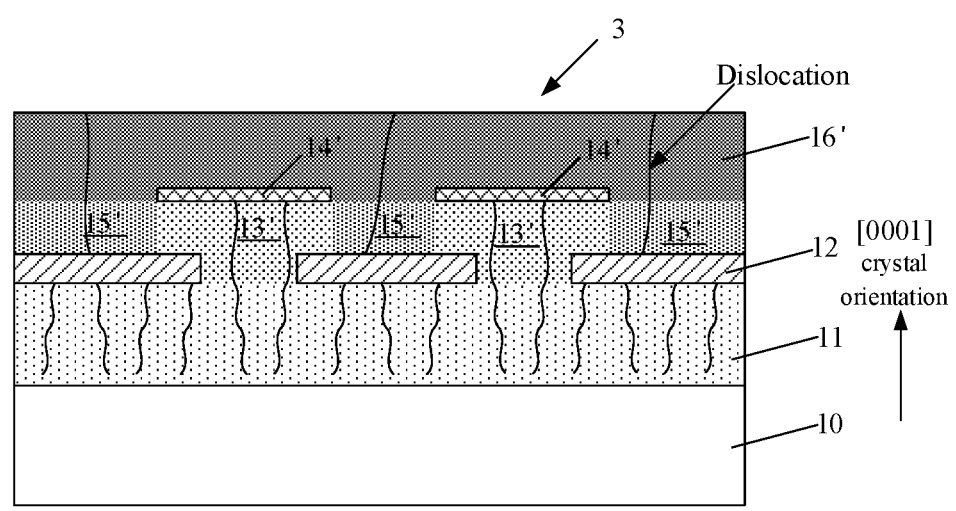
FIG. 9 is a schematic cross-sectional view illustrating a group-III-nitride structure according to a third embodiment of the present disclosure.

FIG. 9 is a schematic cross-sectional view illustrating a group-III-nitride structure according to a third embodiment of the present disclosure. Referring to FIG. 9, the group-III-nitride structure 3 of the present embodiment is substantially the same as the group-III-nitride structure 1 of the embodiment in FIG. 1 and the group-III-nitride structure 2 of the embodiment in FIG. 8, the difference merely lies in that the second group-III-nitride epitaxial layer 13 is an in-situ second group-III-nitride epitaxial layer 13', the second mask layer 14 is an in-situ second mask layer 14', the third group-III-nitride epitaxial layer 15 is an in-situ third group-III-nitride epitaxial layer 15', the fourth group-III-nitride epitaxial layer 16 is an in-situ fourth group-III-nitride epitaxial layer 16'.

Correspondingly, a method of manufacturing group-III-nitride structure 3 of the present embodiment is substantially the same as the methods of manufacturing the group-III-nitride structures 1 and 2 of the embodiments of FIGS. 1 to 6 and FIGS. 7 to 8. and the difference merely lies in that the growing of the second group-III-nitride epitaxial layer 13 in step S1, the forming of the second mask layer 14 and the growing of the third group-III-nitride epitaxial layer 15 in step S2, and the growing of the fourth group-III-nitride epitaxial layer 16 in step S3 are performed in a same MOCVD device.

The advantages of in-situ processes, i.e., processes being performed in the same MOCVD device, are that the process complexity can be reduced, the transfer processes between different devices in a plurality of processes are reduced, and the contamination source is avoided to participate in the processes interfering with the quality of the second group-III-nitride epitaxial layer 13 and the third group-III-nitride epitaxial layer 15 and the fourth group-III-nitride epitaxial layer 16.

Figure 10:
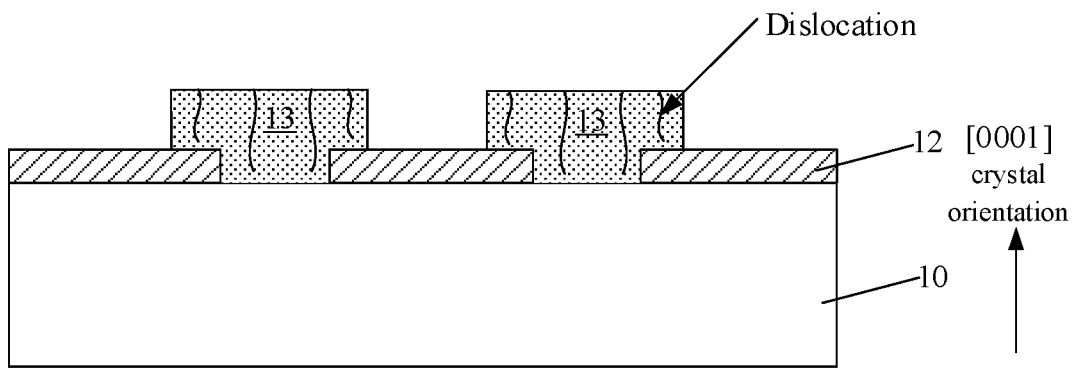
FIG. 10 is a schematic view illustrating an intermediate structure corresponding to a method of manufacturing a group-III-nitride structure according to a fourth embodiment of the present disclosure.
Figure 11:
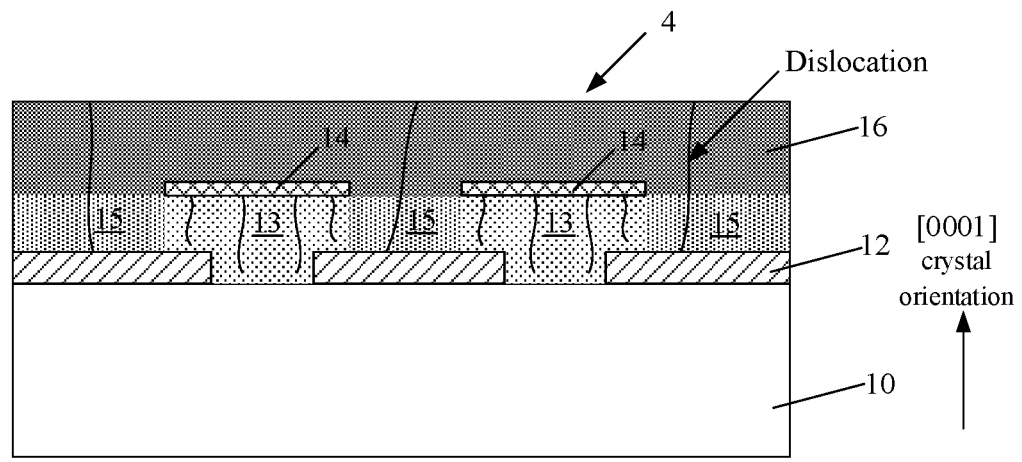
FIG. 11 is a schematic cross-sectional view illustrating a group-III-nitride structure according to a fourth embodiment of the present disclosure.

FIG. 10 is a schematic view illustrating an intermediate structure corresponding to a method of manufacturing a group-III-nitride structure according to a fourth embodiment of the present disclosure. FIG. 11 is a schematic cross-sectional view illustrating a group-III-nitride structure according to a fourth embodiment of the present disclosure. Referring to FIGS. 10 and 11, the group-III-nitride structure 4 and the manufacturing method thereof of the present embodiment are substantially the same as the group-III-nitride structures 1, 2 and 3 and the manufacturing method thereof of the embodiments in FIGS. 1 to 9, and the difference merely lies in that the substrate 10 is replaced with the first group-III-nitride epitaxial layer 11. In other words, in step S1, the first mask layer 12 is formed on the substrate 10, and the second group-III-nitride epitaxial layer 13 formed by the first epitaxial growth selectively grows on the substrate 10.

Figure 12:
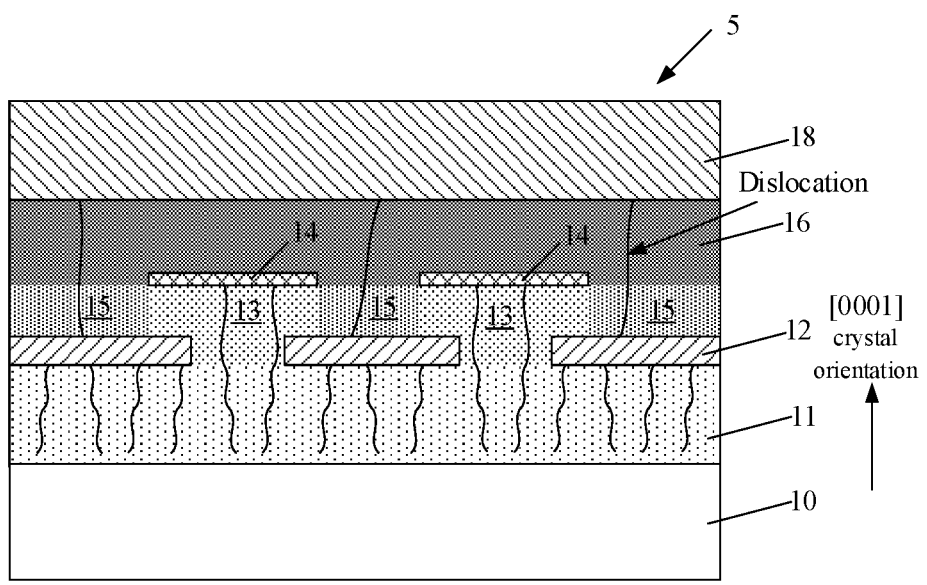
FIG. 12 is a schematic cross-sectional view illustrating a group-III-nitride structure according to a fifth embodiment of the present disclosure.

FIG. 12 is a schematic cross-sectional view illustrating a group-III-nitride structure according to a fifth embodiment of the present disclosure. Referring to FIG. 12, the group-III-nitride structure 5 and the manufacturing method thereof in the present embodiment are substantially the same as the group-III-nitride structures 1, 2, 3 and 4 and the manufacturing methods thereof in the embodiments of FIG. 1 to FIG. 11, and the difference merely lies in that the LED structure 18 is grown and formed on the fourth group-III-nitride epitaxial layer 16.

The LED structure 18 can include an N-type semiconductor layer, a P-type semiconductor layer, and a quantum well layer between the N-type semiconductor layer and the P-type semiconductor layer.

The N-type semiconductor layer is configured to provide electrons, and the P-type semiconductor layer is configured to provide holes, so that electrons and holes combine in the quantum well layer to emit light. The N-type semiconductor layer and/or the P-type semiconductor layer can include a group-III-nitride material. The group-III-nitride material can be at least one of GaN, AlGaN, InGaN, or AlInGaN. N-type ions in the N-type semiconductor layer can be at least one of Si ions, Ge ions, Sn ions, Se ions, or Te ions. P-type doping ions in the P-type semiconductor layer can be at least one of Mg ions, Zn ions, Ca ions, Sr ions, or Ba ions.

In some embodiments, the N-type semiconductor layer can be adjacent to the fourth group-III-nitride epitaxial layer 16, and the P-type semiconductor layer is away from the fourth group-III-nitride epitaxial layer 16. In other embodiments, the P-type semiconductor layer can be adjacent to the fourth group-III-nitride epitaxial layer 16, and the N-type semiconductor layer can be away from the fourth group-III-nitride epitaxial layer 16.

The quantum well layer can be a single quantum well layer or a multi-quantum well layer.

The formation process of the LED structure 18 can refer to the formation process of the fourth group-III-nitride epitaxial layer 16.

Figure 13:
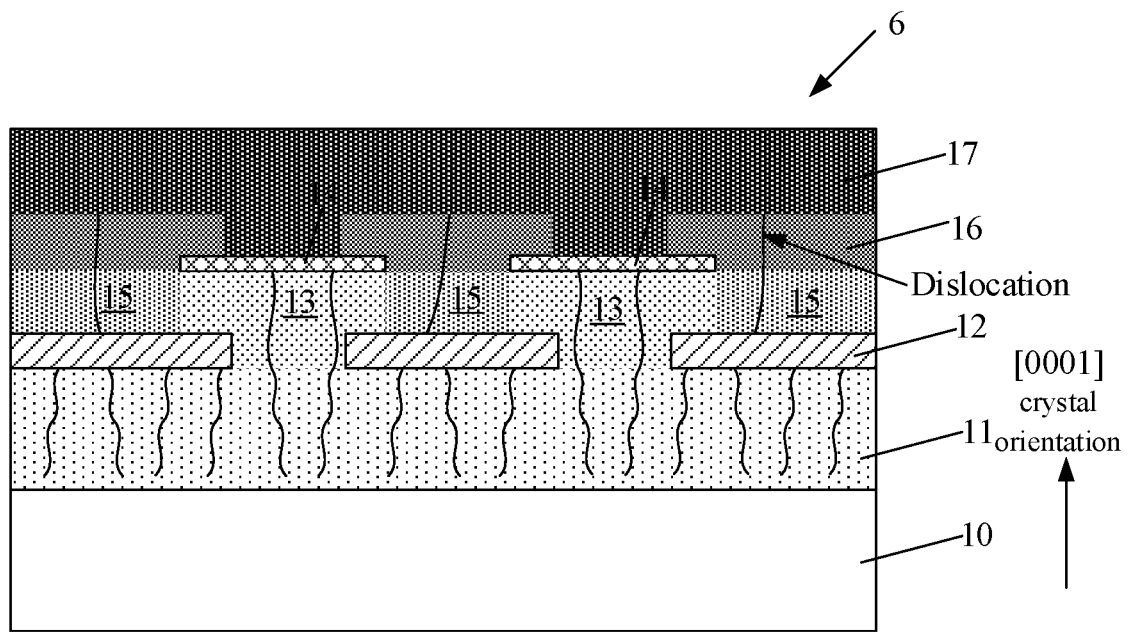
FIG. 13 is a schematic cross-sectional view illustrating a group-III-nitride structure according to a sixth embodiment of the present disclosure.

FIG. 13 is a schematic cross-sectional view illustrating a group-III-nitride structure according to a sixth embodiment of the present disclosure. Referring to FIG. 13, the group-III-nitride structure 6 and the manufacturing method thereof in the present embodiment are substantially the same as the group-III-nitride structures 1, 2, 3 and 4 and the manufacturing methods thereof in the embodiments of FIGS. 1 to 11. The difference merely lies in that when the fourth group-III-nitride epitaxial layer 16 on the second mask layer 14 is not coalesced, a fifth group-III-nitride epitaxial layer 17 is further grown and formed on the second mask layer 14 and the fourth group-III-nitride epitaxial layer 16.

A material of the fifth group-III-nitride epitaxial layer 17 is different from the material of the fourth group-III-nitride epitaxial layer 16.

Element types contained in the material of the fifth group-III-nitride epitaxial layer 17 are more than element types contained in the material of the fourth group-III-nitride epitaxial layer 16. For example, when the material of the fourth group-III-nitride epitaxial layer 16 is GaN, the element types contained in the fifth group-III-nitride epitaxial layer 17 further include at least one of Al or In. When the material of the fourth group-III-nitride epitaxial layer 16 is AlN, the element types contained in the fifth group-III-nitride epitaxial layer 17 at least include at least one of Ga or In.

The material of the fifth group-III-nitride epitaxial layer 17 can be at least one of AlGaN, InGaN, or AlInGaN.

The solution of the present embodiment can also be combined with the solution of the embodiment of FIG. 9, that is, the fifth group-III-nitride epitaxial layer 17 is an in-situ fifth group-III-nitride epitaxial layer. The growing of the fifth group-III-nitride epitaxial layer and the growing of the fourth group-III-nitride epitaxial layer 16 in step S3 are performed in a same MOCVD device.

With the solution of this embodiment, stresses in the fifth group-III-nitride epitaxial layer 17 can be effectively released, and dislocations and V-type pits in the fifth group-III-nitride epitaxial layer 17 can be reduced. If the fifth group-III-nitride epitaxial layer 17 is formed by directly growing on the second mask layer 14 and the third group-III-nitride epitaxial layer 15, V-shaped pits will be formed on the second mask layer 14.

Figure 14:
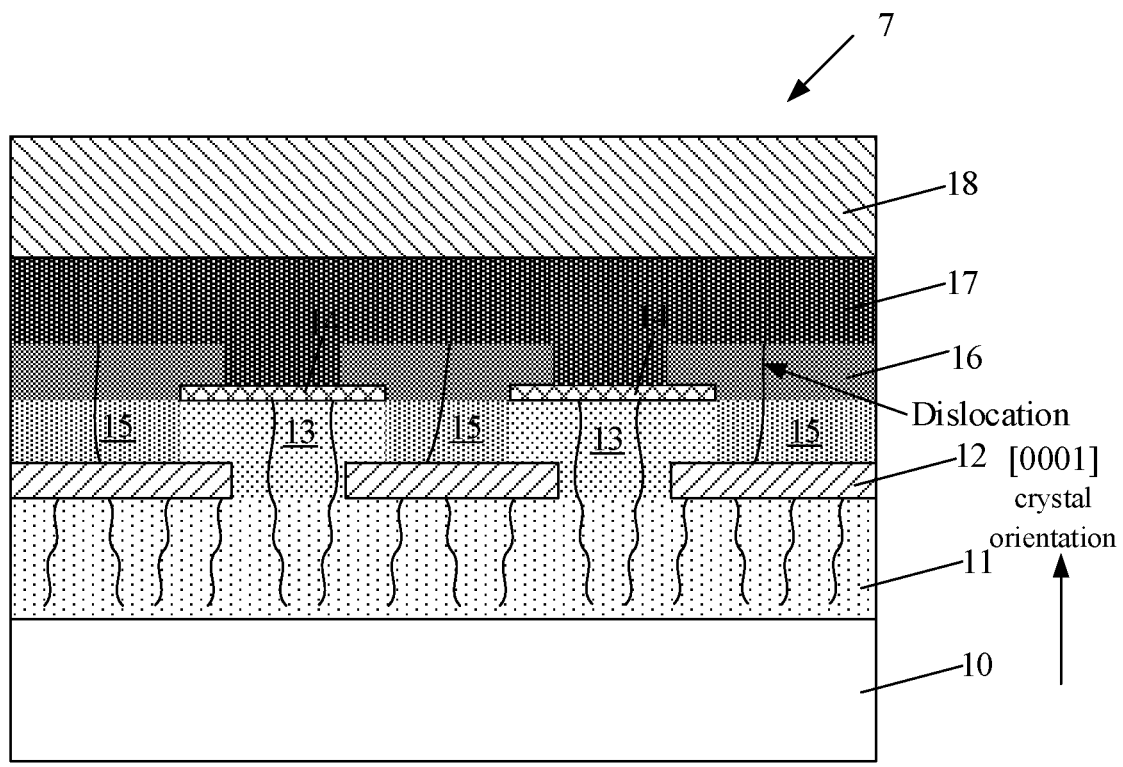
FIG. 14 is a schematic cross-sectional view illustrating a group-III-nitride structure according to a seventh embodiment of the present disclosure.

FIG. 14 is a schematic cross-sectional view illustrating a group-III-nitride structure according to a seventh embodiment of the present disclosure. Referring to FIG. 14, the group-III-nitride structure 7 and the manufacturing method thereof in the present embodiment are substantially the same as the group-III-nitride structure 6 and the manufacturing method thereof in the embodiment of FIG. 13, and the difference merely lies in that an LED structure 18 is further grown and formed on the fifth group-III-nitride epitaxial layer 17.

For the specific structure of the LED structure 18 and the formation method thereof, reference can be made to the specific structure of the LED structure 17 in the embodiment of FIG. 12 and the formation method thereof.

Although the present disclosure is disclosed as above, the present disclosure is not limited thereto. Any person skilled in the art will make various modifications and changes without departing from the spirit and scope of the present disclosure, and therefore the scope of protection of the present disclosure should be set forth by the appended claims.

What is claimed:

1. A method of manufacturing a group-III-nitride structure, comprising:
forming a first mask layer on a substrate;
growing and forming a second group-III-nitride epitaxial layer on the substrate and the first mask layer by performing a first epitaxial growth with the first mask layer as a mask, wherein the second group-III-nitride epitaxial layer on the first mask layer is not coalesced;
forming a second mask layer at least on the second group-III-nitride epitaxial layer;
laterally growing and forming a third group-III-nitride epitaxial layer by performing a second epitaxial growth on the second group-III-nitride epitaxial layer with the second mask layer as a mask, wherein the third group-III-nitride epitaxial layer coalesces the second group-III-nitride epitaxial layer; and
growing and forming a fourth group-III-nitride epitaxial layer on the third group-III-nitride epitaxial layer—and the second mask layer by performing a third epitaxial growth on the third group-III-nitride epitaxial layer; wherein at least one of the second group-III-nitride epitaxial layer, the second mask layer, the third group-III-nitride epitaxial layer, or the fourth group-III-nitride epitaxial layer is in-situ grown.

2. The method of manufacturing the group-III-nitride structure according to claim 1, wherein the substrate has a first group-III-nitride epitaxial layer located thereon.

3. The method of manufacturing the group-III-nitride structure according to claim 1, wherein the second mask layer is further formed on the first mask layer, and the third group-III-nitride epitaxial layer is grown and formed on the second mask layer.

4. The method of manufacturing the group-III-nitride structure according to claim 1, wherein a material of the first mask layer comprises at least one of silicon dioxide or silicon nitride; and/or a material of the second mask layer comprises at least one of silicon dioxide or silicon nitride.

5. The method of manufacturing the group-III-nitride structure according to claim 1, wherein a material of the second group-III-nitride epitaxial layer, a material of the third group-III-nitride epitaxial layer and a material of the fourth group-III-nitride epitaxial layer are the same, and comprise at least one of GaN, AlN, AlGaN, InGaN or AlInGaN.

6. The method of manufacturing the group-III-nitride structure according to claim 1, wherein processes for epitaxial growths of the second group-III-nitride epitaxial layer, and/or the third group-III-nitride epitaxial layer, and/or the fourth group-III-nitride epitaxial layer comprise at least one of an atomic layer deposition method, a chemical vapor deposition method, a molecular beam epitaxial growth method, a plasma enhanced chemical vapor deposition method, a low pressure chemical vapor deposition method, or a metal organic compound chemical vapor deposition method.

7. The method of manufacturing the group-III-nitride structure according to claim 6, wherein the processes for the epitaxial growths of the second group-III-nitride epitaxial layer, the third group-III-nitride epitaxial layer and the fourth group-III-nitride epitaxial layer are the metal organic compound chemical vapor deposition method; and growing the second group-III-nitride epitaxial layer, forming the second mask layer, growing the third group-III-nitride epitaxial layer—and the fourth group-III-nitride epitaxial layer are performed in a same metal organic compound chemical vapor deposition device.

8. The method of manufacturing the group-III-nitride structure according to claim 1, wherein when the fourth group-III-nitride epitaxial layer located on the second mask layer is not coalesced, a fifth group-III-nitride epitaxial layer is further grown and formed on the second mask layer and the fourth group-III-nitride epitaxial layer.

9. The method of manufacturing the group-III-nitride structure according to claim 8, further comprising: growing and forming an LED structure on the fifth group-III-nitride epitaxial layer.

10. The method of manufacturing the group-III-nitride structure according to claim 1, further comprising: growing and forming an LED structure on the fourth group-III-nitride epitaxial layer.

11. A group-III-nitride structure, comprising:
a substrate having a first mask layer located thereon;
a second group-III-nitride epitaxial layer, located on the first mask layer and the substrate, wherein the second group-III-nitride epitaxial layer is not coalesced, and has a second mask layer located thereon;
a third group-III-nitride epitaxial layer, located on the first mask layer and configured to coalesce the second group-III-nitride epitaxial layer;
a fourth group-III-nitride epitaxial layer, located on the third group-III-nitride epitaxial layer and the second mask layer, wherein crystal orientations of the second group-III-nitride epitaxial layer, the third group-III-nitride epitaxial layer and the fourth group-III-nitride epitaxial layer are parallel to a thickness direction of the substrate; wherein the second group-III-nitride epitaxial layer is an in-situ second group-III-nitride epitaxial layer; and/or the second mask layer is an in-situ second mask layer; and/or the third group-III-nitride epitaxial layer is an in-situ third group-III-nitride epitaxial layer; and/or the fourth group-III-nitride epitaxial layer is an in-situ fourth group-III-nitride epitaxial layer.

12. The group-III-nitride structure according to claim 11, further comprising: a first group-III-nitride epitaxial layer located on the substrate or to replace the substrate; wherein the first mask layer-is located on the first group-III-nitride epitaxial layer, and the second group-III-nitride epitaxial layer is connected with the first group-III-nitride epitaxial layer.

13. The group-III-nitride structure according to claim 11, wherein a material of the second group-III-nitride epitaxial layer, a material of the third group-III-nitride epitaxial layer—and a material of the fourth group-III-nitride epitaxial layer are the same, and comprise at least one of GaN, AlN, AlGaN, InGaN or AlInGaN.

14. The group-III-nitride structure according to claim 11, wherein the first mask layer further has the second mask layer located thereon, and the third group-III-nitride epitaxial layer is located on the second mask layer.

15. The group-III-nitride structure according to claim 11, wherein a material of the first mask layer comprises at least one of silicon dioxide or silicon nitride; and/or a material of the second mask layer comprises at least one of silicon dioxide or silicon nitride.

16. The group-III-nitride structure according to claim 11, wherein the fourth group-III-nitride epitaxial layer on the second mask layer is not coalesced, and the second mask layer and the fourth group-III-nitride epitaxial layer have a fifth group-III-nitride epitaxial layer located thereon.

17. The group-III-nitride structure according to claim 16, further comprising: an LED structure located on the fifth group-III-nitride epitaxial layer.

18. The group-III-nitride structure according to claim 11, further comprising: an LED structure-located on the fourth group-III-nitride epitaxial layer.

19. The method of manufacturing the group-III-nitride structure according to claim 1, wherein the substrate is replaced with the first group-III-nitride epitaxial layer; the first mask layer is formed on the first group-III-nitride epitaxial layer, and the first epitaxial growth is an epitaxial growth performed on the first group-III-nitride epitaxial layer.

20. The method of manufacturing the group-III-nitride structure according to claim 1, wherein any two of a material of the second group-III-nitride epitaxial layer, a material of the third group-III-nitride epitaxial layer and a material of the fourth group-III-nitride epitaxial layer are different, and comprise at least one of GaN, AlN, AlGaN, InGaN or AlInGaN.

* * * * *